United States Patent [19]

Amick

[11] 4,361,950

[45] Dec. 7, 1982

[54] METHOD OF MAKING SOLAR CELL WITH WRAP-AROUND ELECTRODE

[75] Inventor: James A. Amick, Princeton, N.J.

[73] Assignee: Exxon Research & Engineering Co., Florham Park, N.J.

[21] Appl. No.: 242,284

[22] Filed: Mar. 10, 1981

Related U.S. Application Data

[62] Division of Ser. No. 133,028, Mar. 24, 1980, abandoned.

[51] Int. Cl.³ ............................................. H01L 31/18
[52] U.S. Cl. ........................................ 29/572; 136/256
[58] Field of Search ........................... 29/572; 136/256

[56] References Cited

U.S. PATENT DOCUMENTS

| | | | |
|---|---|---|---|
| 2,963,390 | 12/1960 | Dickson, Jr. | 148/1.5 |
| 3,046,324 | 7/1962 | Matlow | 136/256 |
| 3,350,775 | 11/1967 | Iles | 29/572 |
| 3,411,952 | 11/1968 | Ross et al. | 136/244 |
| 4,141,811 | 2/1979 | Yerkes et al. | 204/192 E |

FOREIGN PATENT DOCUMENTS 45-31141  8/1970  Japan .................................. 136/256

*Primary Examiner*—Aaron Weisstuch
*Attorney, Agent, or Firm*—Joseph J. Dvorak; Robert S. Salzman

[57] ABSTRACT

A solar cell is provided which has a front electrode which wraps around the edge of the cell and onto a portion of the back of the cell. A second electrode is also provided on the back of the cell thereby permitting all electrical connections to be made on one side of the cell. A method for making such a cell also is disclosed.

4 Claims, 6 Drawing Figures

METHOD OF MAKING SOLAR CELL WITH WRAP-AROUND ELECTRODE

This is a division of application Ser. No. 133,028, filed Mar. 24, 1980, now abandoned.

FIELD OF THE INVENTION

This invention relates in general to electrodes on solar cells, and in particular to a solar cell with wrap-around electrodes and to a method for making such a cell.

BACKGROUND OF THE INVENTION

It is known in the art to prepare silicon solar cells having electrodes and electrode contacts on one side, ane preferably the back surface, of the solar cell. In this regard see, for example, U.S. Pat. No. 3,261,074, U.S. Pat. No. 3,990,100, U.S. Pat. No. 4,157,926 and U.S. Pat. No. 3,502,507 for a description of such cells, their advantages and method of preparation.

From the foregoing, it should be apparent that there are many approaches to preparing solar cells having all the electrical contacts on the back surface of the solar cell.

The present invention is concerned with an improved processing technique for making a solar cell with a wrap-around electrode such that all the electrical contacts shall be on the back surface of the solar cell.

SUMMARY OF THE INVENTION

Broadly stated, the present invention comprises a solar cell having a plurality of current collectors on the top solar sensitive surface of the cell in electrical contact with a first electrode extending in a strip around at least a portion of the top surface of the cell, the edge thereof, and in a strip around the bottom surface of the cell. A second electrode is provided on the bottom surface of the cell separated from said first electrode by a nonmetallized area having at the surface thereof a junction of semiconductor material of opposite conductivity types.

In general, the solar cell is made by the steps of providing a semiconductor body of one conductivity type with a surface layer of opposite conductivity type to form a junction with the bulk portion of the semiconductor body. The surface layer provided extends over the entire top solar sensitive surface of the semiconductor body, around the end edges thereof and onto a strip around the perimeter of the back surface of the semiconductor body. A grid and electrode pattern is provided on the light sensitive top surface of the semiconductor body and to a strip around at least a portion of the top surface of the semiconductor, the edge thereof and a strip around the perimeter back surface of the semiconductor. A second electrode pattern is provided on the back surface of the semiconductor which is separated from the perimeter by a non-metallized P-N junction region. A solar cell is thereby provided having a top electrode which wraps around the cell to the back surface thereof so that all electrical contacts with the solar cell may be made on the back surface of the cell.

In a particularly preferred embodiment of the present invention, the semiconductor body of one conductivity type is provided with a surface layer of opposite conductivity type which extends around the edge of the semiconductor body into a narrow band on the perimeter of the semiconductor by first providing an assembly of two semiconductor bodies which are in contact with and separated by an inert separator which has the same geometry but with dimensions smaller than the dimensions of the semiconductor body, and thereafter placing the assembly in an atmosphere of predetermined temperature and composition sufficient to diffuse a material onto the surface of the semiconductor body, thereby forming the surface layer of opposite conductivity type.

The invention will be better understood when read in light of the detailed description and drawings.

DETAILED DESCRIPTION OF THE INVENTION

Figure 1:
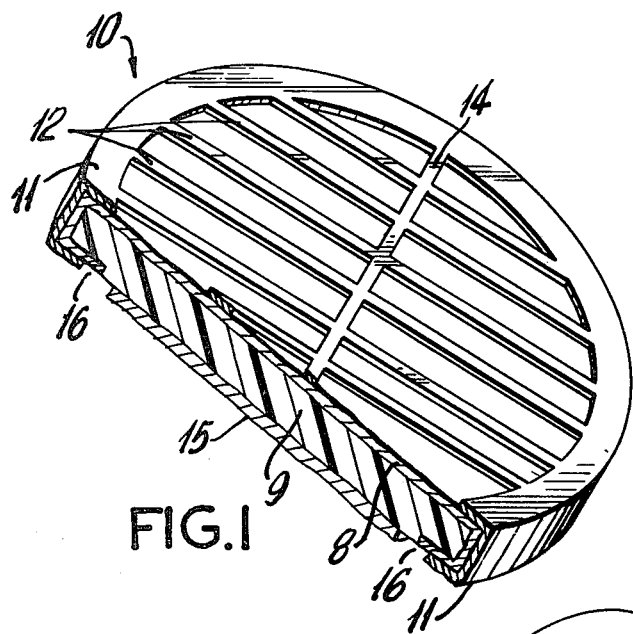
FIG. 1 is a perspective view partly in section of a solar cell with wrap-around electrodes.

Turning now to the drawings, and more particularly to FIG. 1, a particularly preferred solar cell 10 of this invention has a wrap-around electrode 11 extending completely around the top perimeter of the semiconductor body over the edge thereof and completely around the perimeter of the bottom portion of the semiconductor body. The cell has a plurality of finger-like metallic current collectors 12 on the top surface of the solar cell which are in electrical contact with electrode 11. Optionally and preferably the cell is also provided on the top surface with a bus bar 14 also in electrical contact with wrap-around electrode 11 and current collectors 12. A second electrode 15 covers a substantial portion of the back surface of the solar cell 10. Interposed between the electrode 15 and electrode 11 on the back surface is a non-metallized area 16 having a semiconductor junction exposed at the surface of area 16. The semiconductor body 9 is of one conductivity type and has a surface layer 8 of opposite conductivity type which covers the top surface of the semiconductor and extends around the edge of the semiconductor to and over the perimeter of the back surface of the semiconductor body.

As will be appreciated, the semiconductor body may be any material suitable for forming a solar cell; however, in the description which follows reference will be made specifically to silicon. Indeed, for convenience, the semiconductor body 9 will be referred to generally as a P-type silicon and the surface layer 8 as an N-type silicon.

Figure 3:
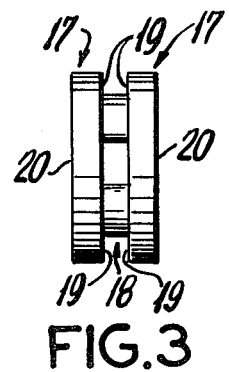
FIG. 3 is a side elevation illustrating another step in the method of the present invention.
Figure 4:
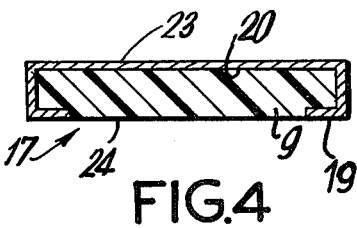
FIG. 4 is a cross-sectional view illustrating another aspect of the present invention.
Figure 2:
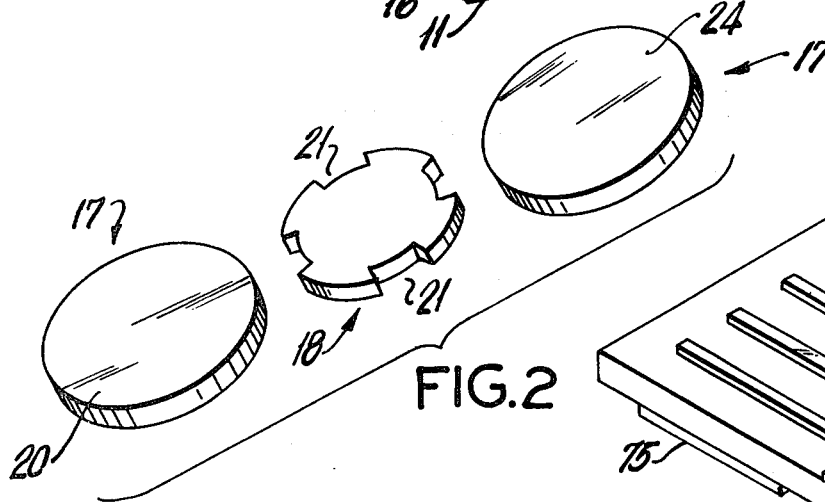
FIG. 2 is an isometric drawing partly in perspective showing one step of the preferred technique for forming a solar cell in accordance with the invention.

In the preparation of solar cell 10, two P-type silicon discs 17, for example, are placed in an appropriate caddy for diffusion of an N-type layer onto the surface of the silicon by convential diffusion techniques. The silicon discs 17 are arranged in sandwich fashion as shown in FIGS. 2 and 3 with a chemically inert spacer 18 between the cells. This spacer has the same shape as the silicon solar cell but is of a smaller diameter so that a rim 19 in the range of, for example, .05 to .10 inches is provided around the perimeter of the surface of the silicon wafers facing each other in the sandwich construction so that the N-type material diffuses in the rim region 19 as well as on the major top surface 20 of the silicon wafers 17. Preferably, the spacer 18 is made of quartz. Optionally spacer 18 also is provided with cut-out portions 21 which will serve to define tab regions 22 on the back surface of the silicon solar cell which ultimately will define a contact region on the wrap-around electrode as is described in greater detail hereinafter. The sandwich of silicon wafers 17 and spacer 18 are placed in an appropriate atmosphere, for example, a phosphorus containing atmosphere, at temperatures, for example of about 850° C. to about 900° C. for about one-half hour thereby providing a surface layer 23 of N-type conductivity to a depth of a fraction of a micron not only on the top surface 20 of the silicon wafer 17 but also extending around the edge of the wafer and into the rim region 19 on the back surface of the wafer 17 (see FIG. 4).

Figure 6:
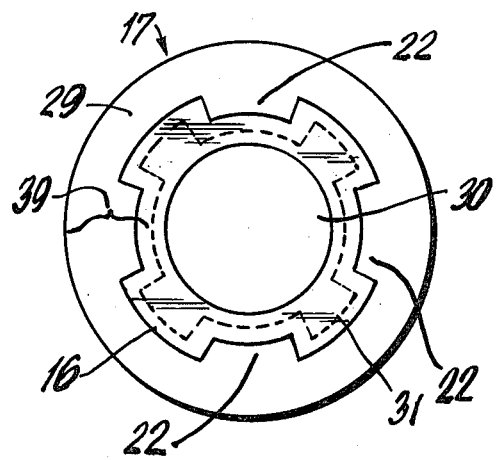
FIG. 6 is a top plan view of the bottom surface of a metallized solar cell prepared in accordance with the process of the present invention.

Next, the surface of the silicon wafer 17 is masked, for example with a rubber mask, to cover a substantial area of diffused rim region 19 on the back surface of the wafer 17. After masking, the remaining exposed portion of the wafer 17 is sandblasted in the conventional manner to remove any phosphorus diffused region in the exposed area. After removal of the mask, this abrasive treatment leaves a well-defined junction between N-type diffused silicon around the back surface of the wafer 17 and a central P-type region, the junction being shown as dotted line 31 of FIG. 6.

Subsequently, the entire wafer is cleaned by conventional cleaning agents, such as hydrofluoric acid to remove the phosphorus glass and the abrasive residues. For example, the wafer is washed in a bath composed of aqueous HF and then rinsed with deionized water and dried.

Figure 5:
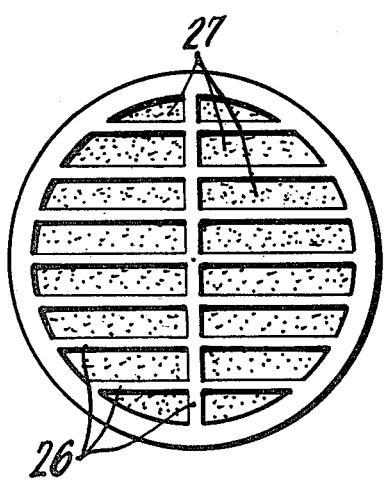
FIG. 5 is a top plan view showing the metal pattern for electrical contacts applied to the top surface of a solar cell prepared in accordance with the present invention.

Thereafter a resist pattern is applied to the front surface of the diffused and cleaned wafer 17 by a suitable patterning technique, such as photolithography or silk screening. In FIG. 5 the shaded areas 27 are the areas covered by the appropriate screening ink. Thus, the unmasked portion 26, which will be metallized, defines the metallization pattern on the top surface of the wafer. As can be seen, the unmasked area has a portion which extends around the perimeter of the silicon wafer and over the edge thereof. Additionally, on the back surface of the wafer, similar resist pattern is formed so as to provide a region 16 on the back surface of silicon wafer 17 which will not be metallized. This region covers the boundary (shown by dotted line 31) between the N- and P-type semiconductor materials. Thus, the area within line 31 on the back surface of wafer 17 is a P-type semiconductor material and region 39 encompassing the area from line 31 to the edge of the wafer is an N-type semiconductor material. Also, as can be seen as a result of the patterning, the portion 29 around the perimeter of wafer 17, the tab regions 22 and the central area 30 of the wafer 17 remain available for metallization.

After applying the appropriate screening ink in the pattern outlined above, the entire wafer is metallized with a conventional electroless nickel plating solution. The nickel plated portion on the front surface 26 extends, of course, around the rim of the wafer onto the back surface 29 and 30 including the tab regions 22. Other plating solutions, of course, could be used such as cobalt or copper.

After metallizing the wafer the resist is removed, typically by washing with an appropriate solvent. In general, solvents such as acetone, hydrocarbons and chlorohydrocarbons are appropriate solvents. The choice of solvent depends upon the choice of resist used. Since these are commercially available materials, it is best to follow the manufacturer's prescribed techinque for removal of the resist.

Next the plated portions 26, 29 and 30 are tinned or coated with solder to permit ohmic connection to the nickel plated portions. Moveover, since the nickel plate is thin and of relatively high restivity, the solder increases the efficiency of the cell as well as improving the electrical conductivity of contacts made to the cell. Also, it should be noted that during the electroless nickel metallization and solder coating procedures a continuous ring of solder forms around the rim for a small distance in from the rim on both sides of the silicon solar cell. In this manner a wrap-around contact is formed automatically during the metallization procedure.

Finally, the wafer is etched in hot caustic to remove work-damaged silicon from the P-N junction region in area 16 on the back of the wafer. During this step, the front surface may be protected by a coating of a suitable resist material such as black wax or an asphalt-based screen-printed ink. Following the etching step, the resist layer is removed with a suitable solvent, such as chlorinated hydrocarbons. If desired, the wafer may then be treated with a room temperature solution of hydrogen peroxide, rinsed in water and dried. These treatments are typical treatments employed in the conventional techniques of forming silicon power devices. As desired, an antireflection coating may be applied to the front surface of the cell by any of the techniques well known in the art, such as the evaporation or sputtering of tantalum oxide, or the spray coating of silicon-titanium oxide.

The resultant solar cell of FIG. 1 is seen to have an electrode 11 which wraps around from the front surface of the silicon solar cell to the perimeter of the rear surface of the solar cell. Thus, in this manner, electrical contacts can be made on the back surface of the wafer to the electrodes 11 and 15 thereby providing numerous advantages, particularly in the packaging of the solar cells in modules.

Figure 7:
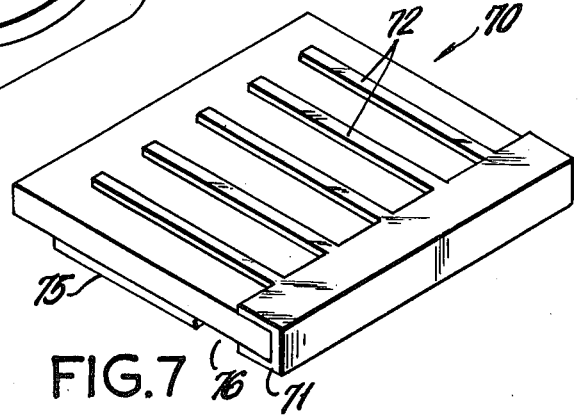
FIG. 7 is a perspective view of an alternate embodiment of the solar cell of the present invention.

In the embodiment described above, the wrap-around electrode extended completely around the perimeter, both top and bottom of the circular solar cell. It should be readily apparent that the electrode need only to cover a portion of the perimeter of the cell. For example, in the embodiment shown in FIG. 7 the solar cell 70 is a rectangular cell having wrap-around electrode 71 extending along only a portion of the top perimeter of the cell around the edge and on a strip on a portion of the back surface of the cell. As shown, solar cell 70 is provided with a plurality of current collectors or fingers 72 on the top light incident surface of cell 70. Also provided is a second electrode 75, located on the bottom of the cell 70. Interposed between electrodes 71 and 75 on the back of cell 70 is a nonmetallized area 76 having a semiconductor junction exposed at the surface of the area 76.

As should be readily apparent, while the foregoing process is described in connection with specifically shaped solar cells, the process is equally adaptable to other shapes such as semicircular and ribbon shaped solar cells.

Finally, although this invention has been described with respect to its preferred embodiments, it should be understood that many variations, modifications will now be obvious to those skilled in the art, and it is intended, therefore, that the scope of the invention be limited not by the specific disclosure herein but only by the appended claims.

What is claimed is:

1. A method of making a solar cell with a wrap-around electrode whereby said cell has electrodes on the back surface thereof comprising:
   providing a back-to-back assembly of two semiconductor bodies of one conductivity type separated by a chemically inert spacer having substantially the same geometry, but of smaller dimensions as said semiconductor body;
   treating said assembly with a dopant material whereby a surface layer of opposite conductivity type is deposited over the entire surface of said semiconductor bodies, around the edges thereof and in a strip around the perimeter of the back surface of said semiconductor body;
   abrading the back surface of said semiconductor body to define a junction between the bulk portion of said semiconductor body and said surface layer;
   forming a grid and first electrode pattern on said surface layer, said first electrode pattern extending in a strip along at least a portion of the perimeter of the top surface of said semiconductor, around the edge thereof and in a strip along at least a portion of the perimeter of the back surface of said cell;
   forming a second electrode pattern on the back of said semiconductor body and in contact with the bulk portion thereof, said second electrode pattern separated by an area having at the surface thereof said junction between said surface layer and said bulk portion; and
   metallizing said patterns.

2. The method of claim 1 wherein said abrading includes the steps of first masking said surface layer on the back of said cell and subjecting said cell back to sandblasting.

3. The method of claim 2 wherein said metallizing includes electroless deposition of a first metal layer and the deposition of a second solder metal layer.

4. The method of claim 3 wherein said solder is deposited by dipping said cell in molten solder.

* * * * *